(12) United States Patent
Hamada

(10) Patent No.: US 8,968,468 B2
(45) Date of Patent: Mar. 3, 2015

(54) METHOD OF CONTROLLING SINGLE CRYSTAL DIAMETER

(75) Inventor: Ken Hamada, Tokyo (JP)

(73) Assignee: Sumco Corporation, Tokyo (JP)

( * ) Notice: Subject to any disclaimer, the term of this patent is extended or adjusted under 35 U.S.C. 154(b) by 1131 days.

(21) Appl. No.: 12/732,492

(22) Filed: Mar. 26, 2010

(65) Prior Publication Data

US 2010/0263585 A1 Oct. 21, 2010

(30) Foreign Application Priority Data

Mar. 27, 2009 (JP) ................................. 2009-079304

(51) Int. Cl.
C30B 15/20 (2006.01)
C30B 15/26 (2006.01)
C30B 15/28 (2006.01)

(52) U.S. Cl.
CPC ................. *C30B 15/26* (2013.01); *C30B 15/28* (2013.01)
USPC ................. 117/15; 117/14; 117/13; 117/201; 117/203

(58) Field of Classification Search
USPC ................................ 117/13, 14, 15, 201, 203
See application file for complete search history.

(56) References Cited

U.S. PATENT DOCUMENTS

| 5,935,325 A * | 8/1999 | Tsuji et al. ..................... 117/208 |
| 6,226,032 B1 | 5/2001 | Lees et al. |
| 2002/0043206 A1* | 4/2002 | Mutti et al. ..................... 117/14 |
| 2010/0128253 A1* | 5/2010 | Yanagimachi et al. ......... 356/30 |

FOREIGN PATENT DOCUMENTS

| JP | 09-235182 | 9/1997 |
| JP | 2003-176199 | 6/2003 |
| JP | 2009-57236 | 3/2009 |
| JP | 2010-132490 | 6/2010 |
| WO | WO 2009028134 A1 * | 3/2009 .............. C30B 15/22 |

* cited by examiner

*Primary Examiner* — Matthew Song
(74) *Attorney, Agent, or Firm* — Clark & Brody

(57) ABSTRACT

When pulling and growing a single crystal from a raw material melt by the Czochralski method, a boundary between the single crystal and the raw material melt is imaged by an optical sensor, and also the weight of the single crystal is measured by a weight sensor, a diameter value of the single crystal is calculated on the basis of first measured values of the diameter of the single crystal derived from image data captured by the optical sensor and second measured values of the diameter of the single crystal derived from weight data captured by the weight sensor, and a pulling rate of the single crystal and the temperature of the raw material melt are adjusted on the basis of the calculated diameter value to thereby control the diameter of the single crystal, and thus it is possible to accurately measure the diameter of a growing single crystal.

2 Claims, 4 Drawing Sheets

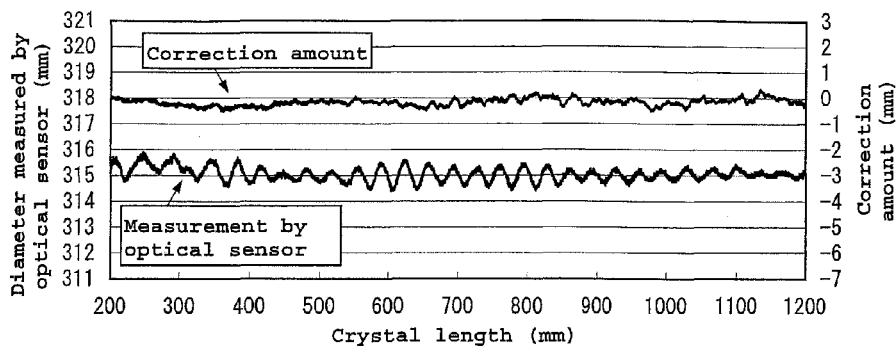
FIG.3A 60 min average (by moving average)
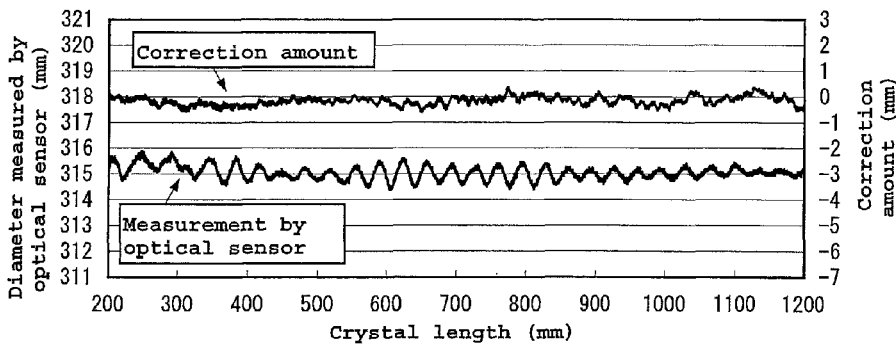
FIG.3B 45 min average (by moving average)
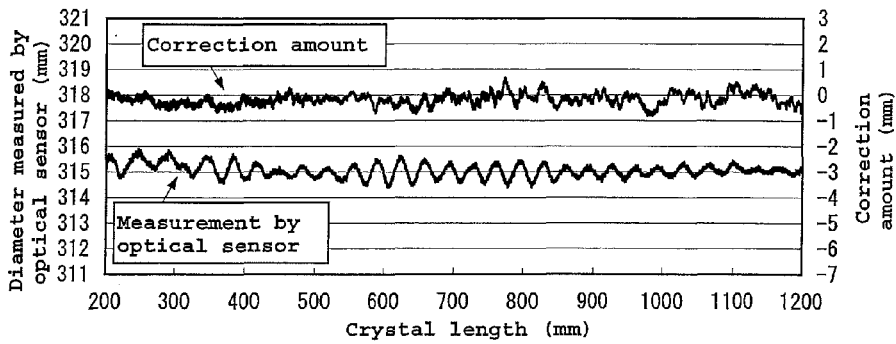
FIG.3C 30 min average (by moving average)
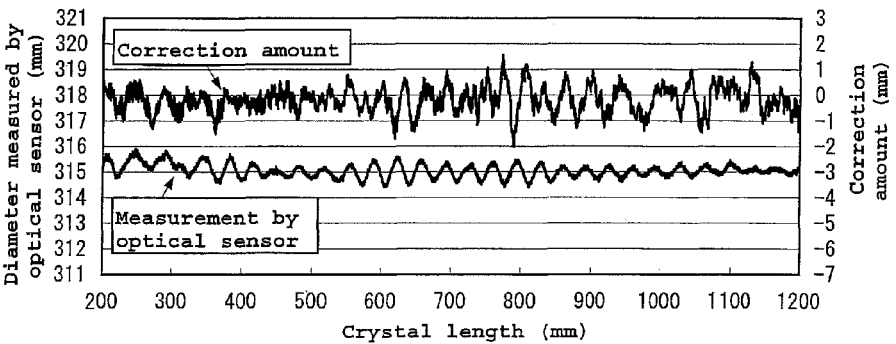
FIG.3D 15 min average (by moving average)

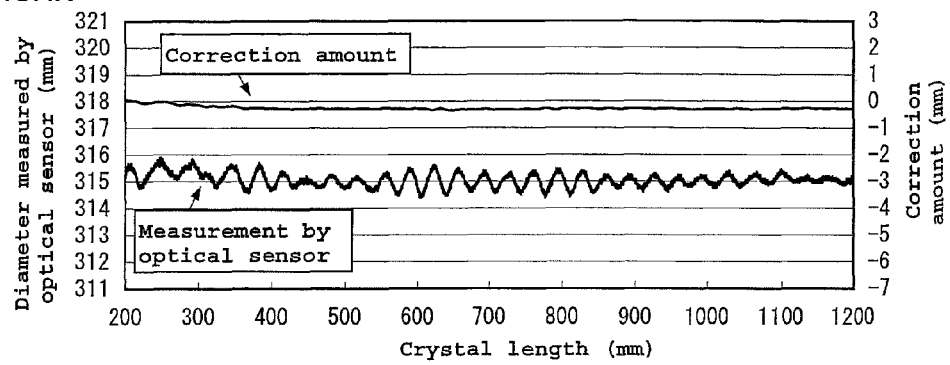
FIG.4A  60 min average (by least squares method)
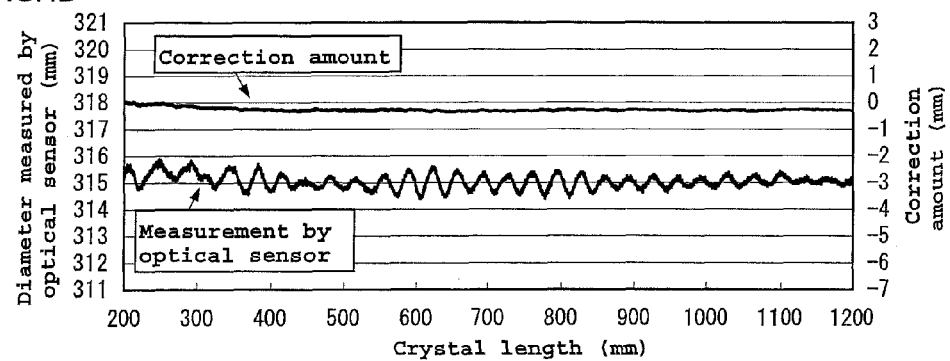
FIG.4B  15 min average (by least squares method)

METHOD OF CONTROLLING SINGLE CRYSTAL DIAMETER

BACKGROUND OF THE INVENTION

1. Field of the Invention

The present invention relates to a method of controlling the diameter of a single crystal when the single crystal is pulled and grown from a raw material melt by the Czochralski method (hereinafter, referred to as the "CZ method"), and particularly to a method of controlling the diameter of a single crystal that enables the precise measurement of diameter of a growing single crystal.

2. Description of the Related Art

A single crystal silicon is a material for a silicon wafer used for a semiconductor device, and the CZ method excellent in mass production is widely adopted for the production of the single crystal silicon. During the growing of a single crystal by the CZ method, a seed crystal is dipped into a raw material melt of silicon retained in a crucible within a chamber maintained in an inert atmosphere under reduced pressure, and the dipped seed crystal is gradually pulled, thereby growing a single crystal silicon below the seed crystal.

When the single crystal is grown, the diameter of the single crystal is sequentially measured, and the diameter control that adjusts the pulling rate of the single crystal and the temperature of the raw material melt is performed so that the single crystal diameter becomes an aimed diameter. Conventionally, the approaches that measure the diameter of a single crystal include an optical system using an optical sensor such as a one-dimensional camera and two-dimensional camera and a weight system using a weight sensor such as a load cell.

In the optical system, the boundary (meniscus) between the single crystal and the raw material melt is imaged by the optical sensor, and the diameter of the single crystal is derived from the brightness distribution of the image data. This approach detects a ring-like portion (hereinafter, also referred to as a "fusion ring") that appears along the boundary between the single crystal and the raw material melt and has the brightness higher than the surrounding thereof, and converts the ring-like portion into the diameter of the single crystal.

When a one-dimensional camera is used as an optical sensor, positions scanned in parallel to a line traversing the center of the fusion ring, i.e., the center of the single crystal, are imaged, and the diameter of the single crystal is determined from the distance between pixels where the peak of brightness appears. When a two-dimensional camera is used as an optical sensor, a half of the fusion ring is imaged, a circular arc formed by connecting pixels where the peak of brightness appears is calculated, and the center of the fusion ring is calculated from this circular arc so as to determine the diameter of the single crystal.

On the other hand, in the weight system, the weight of a single crystal is measured by a weight sensor, and the diameter of the single crystal is derived from the weight difference between the weight data and the model weight.

In the growing of a single crystal in which the diameter control by the optical system is adopted, a wire is typically used as a pulling shaft that holds a seed crystal and pulls the single crystal. While in growing a single crystal in which the diameter control by the weight system is adopted, a rod called a force bar is typically used as the pulling shaft.

In the diameter control of a single crystal, it is important to accurately measure the diameter of the growing single crystal. The reasons for this are as follows. If a measured diameter of a single crystal is misjudged to be larger than the actual diameter, the product quality is adversely influenced because the actual single crystal diameter is small, and further defective products are generated because the diameter of the single crystal does not reach the diameter of the product, which might incur an enormous loss. On the other hand, if the measured diameter of a single crystal is misjudged to be smaller than the actual diameter, the total length of the single crystal is shortened because the actual diameter of the single crystal is large, which might decrease the yield of the product.

However, in case of the diameter measurement by the optical system described above, since the fusion ring at the growth interface is measured and thus the response to an instantaneous diameter change is excellent, the spread of a microscopic diameter fluctuation at the measured site can be accurately detected. However, the distance from the optical sensor to the fusion ring to be measured may fluctuate due to the effects such as the strain of the wire (pulling shaft) in association with progression of the single crystal growth, and issues related to materials (quartz crucible, graphite crucible, and polysilicon) like dimensional accuracy, degradation and weight change. Therefore, in the diameter measurement by the optical system, it is difficult to detect the error of the diameter fluctuation occurring in the direction of the crystal growth, resulting in the lack of reliability in accuracy of the measured diameter of the single crystal.

On the other hand, in case of the diameter measurement by the weight system as described above, since the weight of a grown single crystal itself is measured, the change in the diameter fluctuation in the crystal growth direction in association with progression of single crystal growth is accurately detected. However, since it requires a processing for excluding the influence on the diameter fluctuation which is attributable to the buoyancy acting on the growing single crystal, its responsiveness is poor. Hence, it is difficult to detect the spread of the microscopic diameter fluctuation, resulting in the lack of reliability in accuracy of the measured diameter of the single crystal.

Accordingly, in the diameter control of a single crystal, an approach is desired that can accurately measure the diameter of a growing single crystal.

For example, Japanese Patent Application Publication No. 2003-176199 discloses a method of controlling the diameter of a single crystal in which, at the stage of growing a single crystal up until a cylindrical body portion, the diameter control is performed by the diameter measurement by the optical system, and at the stage of forming a tail portion subsequent to the body portion, in which the diameter of the single crystal is successively decreased, the diameter control is switched and performed by the diameter measurement by the weight system. In the method disclosed in this document, since the fusion ring is hidden by the body portion and cannot be sufficiently imaged at the stage of forming the tail portion, the weight system is adopted instead of the optical system so as to perform the diameter control of the single crystal.

However, also in the method of controlling the diameter of a single crystal disclosed in Japanese Patent Application Publication No. 2003-176199, the fact remains that the diameter measurement is carried out by either the optical system or the weight system at individual growth stages respectively, and therefore the diameter of a growing single crystal cannot be accurately measured.

SUMMARY OF THE INVENTION

The present invention has been made considering the above problems, and its object is to provide a method of controlling the diameter of a single crystal that can accurately measure the diameter of a growing single crystal when performing the diameter control during the growth of the single crystal.

The present inventor has rigorously studied for attaining the above objective and found that, for accurately measuring the diameter of a single crystal when performing the diameter control during the growth of the single crystal, it is effective to perform simultaneously the diameter measurement by the optical system and the diameter measurement by the weight system, and calculate a diameter value of the single crystal on the basis of measured values of the single crystal diameter derived from the respective diameter measurements.

The present invention has been completed on the basis of the above finding and its subject matter lies in the method of controlling the diameter of a single crystal as described below. That is, a method of controlling the diameter of a single crystal includes the steps of: when pulling and growing the single crystal from a raw material melt by the Czochralski method; imaging the boundary between the single crystal and the raw material melt by an optical sensor, and also measuring the weight of the single crystal by a weight sensor; calculating a diameter value of the single crystal on the basis of a first measured values of the diameter of the single crystal derived from image data captured by the optical sensor and a second measured values of the diameter of the single crystal derived from weight data captured by the weight sensor; and adjusting a pulling rate of the single crystal and the temperature of the raw material melt, wherever needed, on the basis of the calculated diameter value to thereby control the diameter of the single crystal.

In this method of controlling the diameter, it is preferable that a first and second measured values are sequentially accumulated, and the coefficient of a formula used for calculation of the diameter value is updated on the basis of average values of the accumulated first and second measured values within a predetermined period.

According to the method of controlling a single crystal diameter of the present invention, since the diameter measurement by the optical system and the diameter measurement by the weight system are simultaneously performed, and the diameter value of the single crystal is calculated on the basis of the first and second measured values of the diameter of the single crystal derived from the respective diameter measurements, the diameter of the growing single crystal can be accurately calculated and the diameter can be appropriately controlled as compared with the diameter value evaluated only by the diameter measurement by the optical system or only by the diameter measurement by the weight system.

BRIEF DESCRIPTION OF THE DRAWINGS

FIGS. 3A to 3D depict the test results of Inventive Example 1.

FIGS. 4A and 4B depict the test results of Inventive Example 2.

DETAILED DESCRIPTION OF THE PREFERRED EMBODIMENTS

Hereinafter, an embodiment will be described in detail about the method of controlling the single crystal diameter of the present invention.

Figure 1:
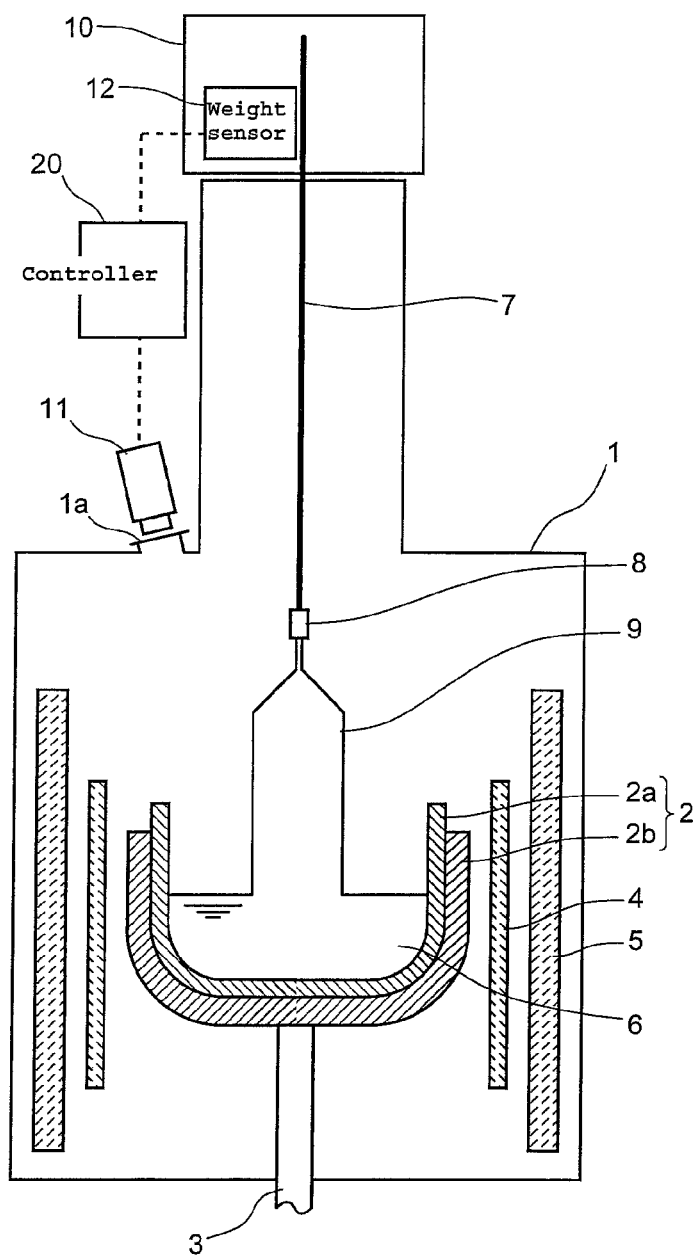
FIG. 1 schematically shows the structure of a single crystal growth apparatus to which a method of controlling a single crystal diameter of the present invention can be applied.

FIG. 1 schematically shows the structure of a single crystal growth apparatus to which the method of controlling the single crystal diameter of the present invention can be applied. As shown in the drawing, the single crystal growth apparatus includes a chamber 1 as an exterior and a crucible 2 disposed at the central region of the chamber 1. The crucible 2 has a double structure made up of an inner quartz crucible 2a and outer graphite crucible 2b. This crucible 2 is fixed to the top end of a support shaft 3, and rotated in a circumferential direction and axially raised or lowered by the rotation drive and raising or lowering drive of the support shaft 3.

A resistance-heating heater 4 that surrounds the crucible 2 is disposed outside the crucible 2, and outside the heater 4, a heat insulator 5 is disposed along the inner surface of the chamber 1. The heater 4 melts solid raw materials such as polysilicon loaded in the crucible 2, thereby forming a raw material melt 6 in the crucible 2.

The pulling shaft 7 such as a wire is provided above the crucible 2 along the same axis as the support shaft 3. The pulling shaft 7 is rotated while being raised or lowered by a pulling mechanism 10 provided on the upper end of the chamber 1. A seed crystal 8 is attached to the tip of the pulling shaft 7. The seed crystal 8 is dipped in the raw material melt 6 in the crucible 2 along with the drive of the pulling shaft 7, familiarized with the raw material melt 6, and then gradually raised while being rotated to thereby grow a single crystal silicon 9 below the seed crystal 8.

An optical sensor 11 and weight sensor 12 are provided in this single crystal growth apparatus to measure the diameter of the growing single crystal 9. The optical sensor 11 is disposed outside the chamber 1 and images a fusion ring of boundary between the single crystal 9 and raw material melt 6 through an observation window 1a provided for the chamber 1. A one-dimensional camera or two-dimensional camera can be used as the optical sensor 11. The weight sensor 12 is disposed in the pulling mechanism 10 and weighs the growing single crystal 9. A load cell can be used as the weight sensor 12.

The optical sensor 11 and weight sensor 12 are wired/liaised to a controller 20. The controller 20 simultaneously receives image data sequentially output from the optical sensor 11 as well as weight data sequentially output from the weight sensor 12 and performs the calculation as described below on the basis of both these image data and weight data to determine the diameter value of the growing single crystal 9. In addition, the controller 20 adjusts the pulling rate of the single crystal and the temperature of the raw material melt, wherever needed, on the basis of the calculated diameter value so as to carry out the diameter control of the single crystal.

Figure 2:
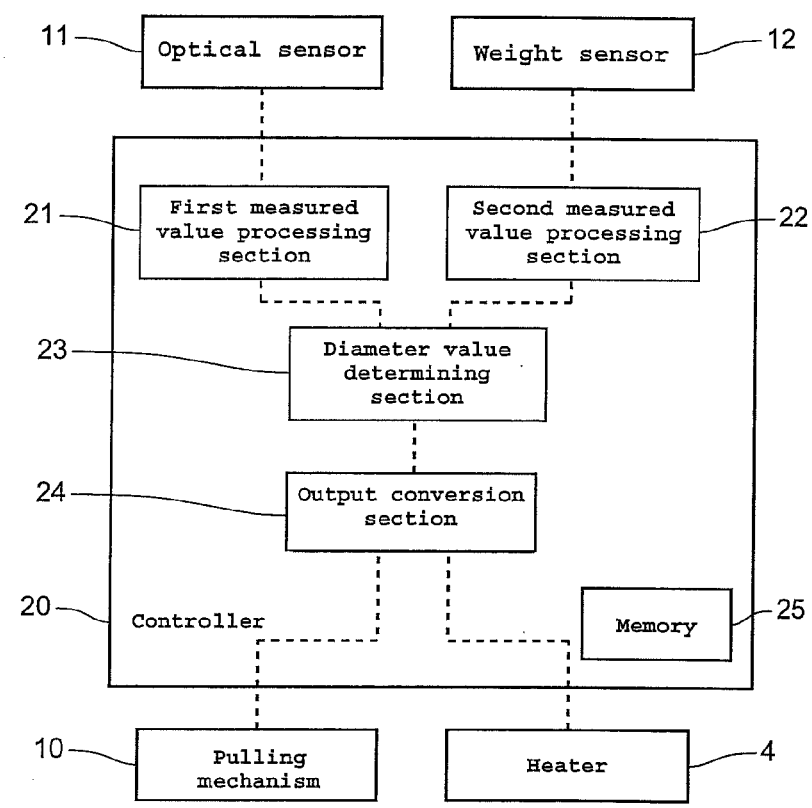
FIG. 2 is a block diagram showing the configuration of a controller used in a method of controlling a single crystal diameter of the present invention.

FIG. 2 is a block diagram showing the configuration of a controller used in the method of controlling the single crystal diameter of the present invention. As shown in the drawing, the controller 20 includes a first measured value processing section 21, a second measured value processing section 22, a diameter value determining section 23, an output conversion section 24, and a memory section 25.

The first measured value processing section 21 is pursuant to the diameter measurement by the optical system and derives first measured values of the diameter of the single crystal on the basis of the image data received from the optical sensor 11. The second measured value processing section 22 is pursuant to the diameter measurement by the weight system and derives the second measured values of the diameter of the single crystal on the basis of the weight data received from the weight sensor 12. The diameter value determining section 23 calculates a diameter value of the single crystal on the basis of the first measured values derived in the first measured value processing section 21 and the second measured values derived in the second measured value processing section 22.

The output conversion section 24 compares the diameter value calculated in the diameter value determining section 23 with a target diameter of the single crystal to be grown, converts it to an output value of the pulling mechanism 10 corresponding to the pulling rate and an output value of the heater 4 corresponding to the temperature of the raw material melt, and liaises the signals of these output values to the pulling mechanism 10 and heater 4 to thereby narrow the difference between the diameter value and the target diameter. As a result, the pulling rate of the single crystal and the temperature of the material melt are adjusted, if necessary, and the diameter control of the single crystal is performed.

In a memory section 25, there are stored data related to calculation formulae used in the first measured value processing section 21, second measured value processing section 22, diameter value determining section 23, and output conversion section 24. Moreover, the memory section 25 sequentially in time series accumulates the first measured values derived in the first measured value processing section 21 and the second measured values derived in the second measured value processing section 22. The accumulated first and second measured values can be utilized in calibration of the calculation formula used to determine the diameter value in the diameter value determining section 23.

As described above, in the present invention, the diameter measurement by the optical system and the diameter measurement by the weight system are simultaneously performed to determine the diameter value of a single crystal on the basis of the first and second measured value of the single crystal diameter derived from each of the diameter measurements, and therefore the diameter of the growing single crystal can be accurately measured and the diameter can be appropriately controlled as compared with the diameter value determined by a mere single diameter measurement means either by the optical system or by the weight system, whereby it becomes possible to perform appropriate diameter control.

A specific example of calculation executed in the above controller 20 will be shown below. In this example, a one-dimensional camera is used as the optical sensor 11.

The diameter value processing section 23 calculates the diameter value using the calculation formula (1) below.

$$D = N \times A \times B \quad (1)$$

wherein, D represents the diameter value [mm], N represents the number of pixels included in between brightness peaks in image data captured by the one-dimensional camera [number of pixels], A represents the weighted coefficient [dimensionless], and B represents the diameter conversion coefficient [mm/number of pixels] reflecting operating performance.

Here, the weighted coefficient A is a coefficient evaluated from the first measured value derived in the first measured value processing section 21 and the second measured value derived in the second measured value processing section 22 and updated for every execution of determination in the diameter value determining section 23 or at a predetermined frequency. The weighted coefficient A is defined, for example, by formula (2) below.

$$A = A' \times \{1 - (D1 - D2)/D2\} \quad (2)$$

wherein, A represents the weighted coefficient after updated, A' represents the weighted coefficient before updated, D1 represents the average value, within a predetermined period, of the accumulated first measured values pursuant to the diameter measurement by the optical system, and D2 represents the average value, within a predetermined period, of the accumulated second measured values pursuant to the diameter measurement by the weight system. The average value D1 of the first measured values by the optical system is evaluated by the moving average, and the average value D2 of the second measured values by the weight system is evaluated by the moving average or the average by the least squares method. In case of the least squares method, since the calculated average value may change suddenly, it is effective to incorporate correction pertinent to the sudden change.

The average value D1 of the first measured values by the optical system can be evaluated by the moving average of formula (3) below.

$$D1 = (D1_{m-o} + D1_{m-o+1} + \ldots + D1_{m-1} + D1_m)/(o+1) \quad (3)$$

wherein m represents a measurement number, whereas o represents the prescribed number of measurements of first measured values for moving average relative to each measurement number.

In case of the moving average, the average value D2 of the second measured values by the weight system can be defined by formula (4) below.

$$D2 = D2_{m-o} + D2_{m-o+1} + \ldots + D2_{m-1} + D2_m)/(o+1) \quad (4)$$

wherein m represents an intended measurement number, whereas o represents the prescribed number of second measured value $D2_i$ for moving average relative to each measurement number.

In addition, $D2_i$ is an average diameter converted from the measured values of the weight of the single crystal by the load cell in a specified interval and evaluated from formula (5) below (2.33: specific gravity of the single crystal silicon).

$$D2_i = 2\sqrt{((W_{i+1} - W_i)/(\pi \times (X_{i+1} - X_i) \times 2.33))} \quad (5)$$

wherein, $X_i$ is an arbitrary position, in the pulling direction, of a cylindrical body portion of the single crystal, $W_i$ is the weight of the single crystal at $X_i$ (actual measured value by the load cell), $X_{i+1}$ is a position which is a specified interval/distance away from $X_i$, and $W_{i+1}$ is the weight of the single crystal at $X_{i+1}$ (actual measured value by the load cell).

Next, in case of the least squares method, the average value D2 of the second measured values by the weight system can be defined by formula (6) below (2.33: specific gravity of the single crystal silicon).

$$D2 = 2\sqrt{(W/2.33\pi L)} \quad (6)$$

wherein, W is the weight of the single crystal for corresponding L which is the length of the specified interval for the cylindrical body portion of the single crystal, and is expressed by W=aL+b.

If W=aX+b is a linear function which is the best approximation to n data $(X_i, W_i): (X_1, W_1), (X_2, W_2), \ldots, (X_n, W_n)$ wherein $X_i$ is an arbitrary position, in the pulling direction, of the cylindrical body portion of the single crystal, and $W_i$ is the weight of the single crystal at $X_i$ (actual measured value by the load cell), a and b are coefficients evaluated by formulae (7) and (8) below.

[Formula 1]

$$a = \left(n\sum_{i=1}^{n} X_i W_i - \sum_{i=1}^{n} X_i \sum_{i=1}^{n} W_i\right) \bigg/ \left(n\sum_{i=1}^{n} X_i^2 - \left(\sum_{i=1}^{n} X_i\right)^2\right) \quad (7)$$

-continued $$b = \left(\sum_{i=1}^{n} X_i^2 \sum_{i=1}^{n} W_i - \sum_{i=1}^{n} X_i W_i \sum_{i=1}^{n} X_i\right) / \left(n \sum_{i=1}^{n} X_i^2 - \left(\sum_{i=1}^{n} X_i\right)^2\right) \quad (8)$$

The number of pixels N in formula (1) above is evaluated as similarly as a conventional diameter measurement using a one-dimensional camera. That is, positions scanned in parallel to a line traversing the center of the fusion ring, i.e., the center of the single crystal, are imaged by a one-dimensional camera, the captured image data is analyzed to evaluate a brightness distribution, and the number of pixels included in between the brightness peaks is counted from the brightness distribution so as to evaluate the number of pixels N.

Moreover, the diameter conversion coefficient B in formula (1) above is a constant that can be set from the operating performance and can be a different value depending on production conditions and equipment configuration. The diameter conversion coefficient B can be set, for example, as follows: an image of a single crystal is captured, and the diameter of the single crystal actually measured by calipers or the like is divided by the number of camera pixels (the number of pixels between both right and left ends of the captured image of the single crystal) so as to evaluate a value from which the coefficient B is set.

During the growth of the single crystal, the weighted coefficient A of formula (1) above is updated using formula (2) above and formula (1) above is calibrated to thereby more accurately measure the diameter value D of the single crystal over the total length of the single crystal. This is because when a wire is used as the pulling shaft, although an error in the diameter value D to be calculated might occur due to the strain of and the degradation of the wire in association with the progression of the single crystal growth, the occurrence of the error is suppressed by the calibration of the calculation formula (formula (1) above) used in the diameter value determining section 23.

However, in case of formula (2) above, if an updating time period for the weighted coefficient A is too short, an error may rather be occurred particularly in the average value D2 of the second measured values by the weight system, as far as it concerns the average value D1 of first measured values by the optical system and the average value D2 of second measured values. Therefore, the updating time period should be appropriately set depending on the constitution of equipment to be used so as not to cause the error in the average value D2.

Additionally, if the period of time adopted to evaluate the average values D1 and D2 which are evaluated by the moving average in formula (2) above is too short, the scatter is likely to be generated in the average values D1 and D2. Hence, the period of time adopted to evaluate the average values D1 and D2 should also be appropriately set so as not to generate the scatter in the average values D1 and D2.

EXAMPLES

Example 1

A test was performed in which a single crystal ingot capable of assuring a diameter of 12 inches after processing its outer periphery was grown. In the test, the diameter measurement by the optical system using a one-dimensional camera and the diameter measurement by the weight system using a load cell were carried out, and the behavior of the diameter value by the measurement by the optical system and the behavior of the diameter difference (correction amount) when the measured value of the diameter by the optical system is corrected with the measured value of the diameter by the weight system were examined along a crystal length-wise direction. In the test of Inventive Example 1, the average value of the measured values of the diameter in formula (2) above was evaluated by the moving average, and 60, 45, 30 and 15 min are adopted as a period of time for the moving average.

FIGS. 3A to 3D depict the test results of Inventive Example 1. The average values of the measurement values of the diameter for 60, 45, 30, and 15 min of time period are shown in FIGS. 3A, 3B, 3C and 3D respectively. As illustrated in FIGS. 3A to 3D, in case of 15 min calculation time period, the scatter of correction amount is noticeable and it cannot be used for the correction. In case of 30, 45 or 60 min as calculation time period, the scatter of correction amount is small, and stable correction is respectively achieved.

Example 2

In Example 2, a test of growing a single crystal ingot as well as an examination was carried out as similarly as in Example 1 above. In the test of Inventive Example 2, the average value of the measured values of the diameter was evaluated by the least squares method, and 60 and 15 min are adopted as a period of time for evaluating the average value.

FIGS. 4A and 4B depict the test results of Example 2. The average values of the measurement values of the diameter for 60 and 15 min of time period are shown in FIGS. 4A and 4B, respectively. As shown in FIGS. 4A and 4B, in both cases of 15 and 60 min calculation time period, the scatter of correction amount is small, and therefore stable correction is possible.

According to the method of controlling a single crystal diameter of the present invention, since a diameter value of a single crystal is calculated on the basis of a first measured values of the single crystal diameter derived from the diameter measurement by the optical system and a second measured values of the single crystal diameter derived from the diameter measurement by the weight system, it is possible to accurately measure the diameter of a growing single crystal and therefore appropriately control the diameter as compared with a diameter value evaluated only by a mere single means for diameter measurement, either by an optical system or by a weight system.

What is claimed is:

1. A method for controlling the diameter of a single crystal when pulling and growing the single crystal from a raw material melt by the Czochralski method, comprising:
    a first step of imaging a boundary between the single crystal and the raw material melt by an optical sensor, and also measuring a weight of the single crystal by a weight sensor;
    a second step of calculating a diameter value of the single crystal on the basis of first measured values of the diameter of the single crystal derived from image data captured by the optical sensor and second measured values of the diameter of the single crystal derived from weight data captured by the weight sensor;
    a third step of adjusting a pulling rate of the single crystal and a temperature of the raw material melt on the basis of the calculated diameter value to thereby control the diameter of the single crystal;
    a fourth step of accumulating said first and second measured values; and
    a fifth step of updating coefficients of formulae used for calculation of the diameter value on the basis of average values of said accumulated first and second measured values for a predetermined time period, wherein the fifth step is carried out during the growth of the single crystal for every execution of the second step or at a predetermined frequency.

2. The method for controlling the diameter of a single crystal according to claim 1, wherein in the second step, the diameter value D [mm] is calculated by the formula (1) below, and in the fifth step, the coefficients A are updated by the formula (2) below:

$$D = N \times A \times B \qquad (1); \text{ and}$$

$$A = A' \times \{1 \cdot (D1 \cdot D2)/D2\} \qquad (2)$$

where in the formula (1), N represents the number of pixels included in between brightness peaks in image data captured by the optical sensor [number of pixels], A represents the weighted coefficient, and B represents the diameter conversion coefficient [mm/number of pixels], and in the formula (2), A represents the weighted coefficient after updating, N represents the weighted coefficient before updating, D1 represents the average value, within a predetermined period, of the accumulated first measured values pursuant to the diameter measurement by the optical system, and D2 represents the average value, within a predetermined period, of the accumulated second measured values pursuant to the diameter measurement by the weight system.

* * * * *

UNITED STATES PATENT AND TRADEMARK OFFICE
CERTIFICATE OF CORRECTION

PATENT NO. : 8,968,468 B2  
APPLICATION NO. : 12/732492  
DATED : March 3, 2015  
INVENTOR(S) : Hamada Page 1 of 1

It is certified that error appears in the above-identified patent and that said Letters Patent is hereby corrected as shown below:

In the claims

Column 9, lines 19-21:

A represents the weighted coefficient after updating, N represents the weighted coefficient before updating
    should read
A represents the weighted coefficient after updating, A' represents the weighted coefficient before updating Signed and Sealed this  
Sixth Day of October, 2015

Michelle K. Lee  
*Director of the United States Patent and Trademark Office*